United States Patent
Kim (10) Patent No.: US 8,524,438 B2
(45) Date of Patent: Sep. 3, 2013

(54) ETCH RESIST SOLUTION, METHOD OF FABRICATING THIN FILM PATTERN USING THE SAME AND METHOD OF FABRICATING AN LCD DEVICE USING THE SAME

(75) Inventor: Jin Wuk Kim, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 790 days.

(21) Appl. No.: 11/980,646

(22) Filed: Oct. 31, 2007

(65) Prior Publication Data
US 2008/0173615 A1 Jul. 24, 2008

(30) Foreign Application Priority Data
Dec. 4, 2006 (KR) .................. 10-2006-0121740

(51) Int. Cl.
 *G03C 1/52* (2006.01)
(52) U.S. Cl.
 USPC ................... 430/191; 430/192; 430/193
(58) Field of Classification Search
 None
 See application file for complete search history.

(56) References Cited

U.S. PATENT DOCUMENTS

| | | | | |
|---|---|---|---|---|
| 3,658,543 A | * | 4/1972 | Gerlach et al. | 430/343 |
| 4,341,859 A | * | 7/1982 | Keane et al. | 430/270.1 |
| 5,124,233 A | * | 6/1992 | Meier et al. | 430/280.1 |
| 5,609,983 A | * | 3/1997 | Kawamura et al. | 430/193 |
| 6,103,443 A | * | 8/2000 | Wanat et al. | 430/191 |
| 2006/0257785 A1 | * | 11/2006 | Johnson | 430/270.1 |
| 2007/0100129 A1 | * | 5/2007 | Sakayori | 528/310 |

FOREIGN PATENT DOCUMENTS

CN 1629699 6/2005

* cited by examiner

*Primary Examiner* — Duy Deo
(74) *Attorney, Agent, or Firm* — McKenna Long & Aldridge, LLP (57) ABSTRACT

A method of fabricating a thin film pattern improve the life of a blanket and reduce the cost and improve reliability in forming the thin film pattern. The method includes injecting an etch resist solution into a blanket on a printing roller, wherein the etch resist solution includes a printing solvent that satisfies the condition $6 > \delta_{solvent}$ or $\delta_{solvent} > 11$, where $\delta_{solvent}$ is the solubility parameter of the solvent, or satisfies the condition $6 < \delta_{solvent} < 11$ and $\mu < 2(D)$, where $\mu$ is the dipole moment of the solvent; rotating the printing roller to uniformly coat the etch resist solution on the blanket; rolling the printing roller coated with the etch resist solution onto a printing plate to pattern the etch resist solution to thereby form an etch resist pattern; transferring the etch resist pattern from the printing roller to a substrate; hardening the etch resist pattern; and forming a desired thin film pattern on the substrate using the etch resist pattern.

15 Claims, 8 Drawing Sheets

FIG. 2

Solubility parameter of Blanket rubber (PDMS) ~ 7.3

FIG. 3

TMP:Trimethylphenol

Xylenol

ETCH RESIST SOLUTION, METHOD OF FABRICATING THIN FILM PATTERN USING THE SAME AND METHOD OF FABRICATING AN LCD DEVICE USING THE SAME

This application claims the benefit of Korean Patent Application No. 10-2006-0121740, filed on Dec. 4, 2006, which is hereby incorporated by reference for all purposes as if fully set forth herein.

BACKGROUND OF THE INVENTION

1. Field of the Invention

The present invention relates to an etch resist solution and a method of fabricating a thin film pattern for a display panel using the etch resist solution. More particularly, the present invention relates to improving the life of a blanket to reduce the cost and improve reliability in forming the thin film pattern.

2. Discussion of the Related Art

Flat panel display devices are popular because they are smaller and lighter than cathode ray tube devices. Examples of flat panel display devices include liquid crystal display devices, field emission display devices, plasma display panel devices and electroluminescence (EL) displays.

In a liquid crystal display device, a picture image is displayed by controlling the transmission of light through liquid crystal. Light transmittance is controlled by using an electric field. Thus, liquid crystal display devices may include a liquid crystal display panel provided with liquid crystal cells, typically arranged in a matrix, and a driving circuit for driving the liquid crystal display panel.

The liquid crystal display panel may include a thin film transistor array substrate, a color filter array substrate, a spacer located between the two substrates to maintain a cell gap, and a liquid crystal filled in the cell gap. The thin film transistor array substrate and the color filter array substrate face each other.

The thin film transistor array substrate may include gate lines, data lines, and thin film transistors formed at portions of the gate lines and the data lines that cross each other. The thin film transistors serve as switching devices. The thin film transistor array substrate may also include pixel electrodes formed in a unit of liquid crystal cell and connected with the thin film transistors. An alignment film may also be deposited on the substrate to cover the above elements. The gate lines and the data lines are supplied with signals from driving circuits through their respective pad portions. The thin film transistors supply pixel signals, supplied to the data lines, to the pixel electrodes in response to scan signals supplied to the gate lines.

The color filter array substrate may include color filters formed in a unit of liquid crystal cell, a black matrix for distinguishing the color filters from one another and reflecting external light, a common electrode commonly supplying a reference voltage to the liquid crystal cells, and an alignment film deposited on the above elements.

The thin film transistor array substrate and the color filter array substrate may be separately fabricated and thereafter bonded to each other. After the substrates are bonded, liquid crystal material is injected between the bonded substrates and the substrates are then sealed. Thus, the related art liquid crystal display panel is completed.

Thin film patterns within the related art liquid crystal display panel may be formed by photolithography processes and etching processes.

Photolithographic processing includes multiple processes, such as exposure, developing, cleaning and inspection. These processes increase the fabricating cost of the liquid crystal display panel. Accordingly, a thin film patterning process may be performed using a reverse resist printing process instead of the photolithography process.

Figure 1:
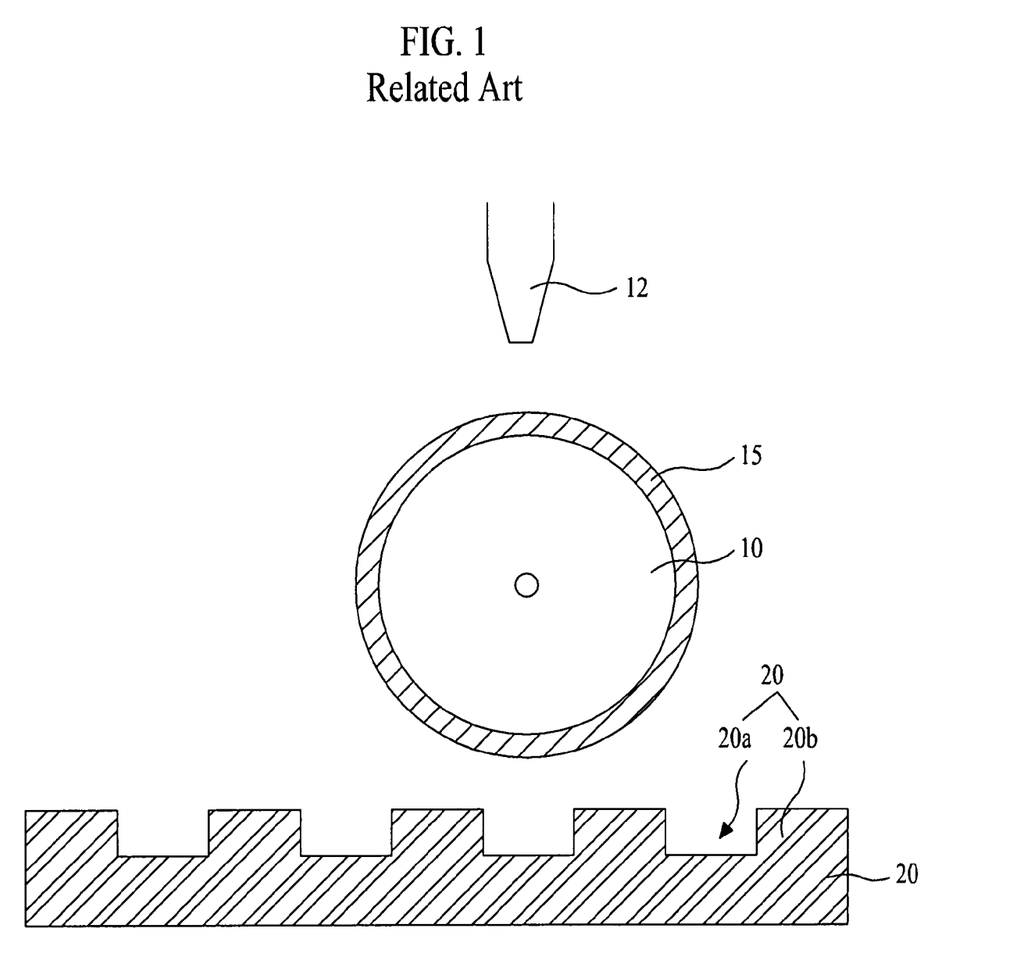
FIG. 1 illustrates a related art reverse resist printing apparatus.

FIG. 1 illustrates a related art reverse resist printing apparatus.

As shown in FIG. 1, the related art reverse resist printing apparatus includes a roll type printing roller 10 in which a blanket 15 is wound, an etch resist solution injector 12 that injects an etch resist resin solution 14a, and an engraved printing plate 20. The engraved printing plate 20 includes a groove 20a having the same pattern as a thin film pattern to be formed and a protrusion 20b. The blanket 15 may be made of polydimethylsiloxane (PDMS).

In the related art reverse resist printing apparatus, after an etch resist solution 14a injected from the etch resist solution injector 12 is coated on the blanket 15 wound on the printing roller 10, the etch resist solution 14a is transferred onto the protrusions 20b only from the printing roller 10. Subsequently, an etch resist pattern 14b is formed on the printing roller 10 and is a desired thin film pattern. This thin film pattern remains on the printing roller 10 and is then transferred onto a substrate, so that an etch resist pattern is formed on the substrate.

The etch resist solution 14a used for the reverse resist printing apparatus may include a base polymer such as novolac, a carrier solvent, a printing solvent, a surfactant, etc. The etch resist solution 14a is injected from the etch resist solution injector 12.

A carrier solvent is a solvent used to uniformly coat the etch resist solution 14a on the blanket 15 by lowering the viscosity of the etch resist solution 14a.

The printing solvent also affects the viscosity of the etch resist solution 14a coated on the blanket 15 and allows the solution 14a to print on the printing plate 20 or the substrate.

A surfactant is a material used to lower the surface tension of the etch resist solution 14a and the surface tension of a surface so that the solution 14a may adhere to the surface.

If a coating process is performed using the aforementioned etch resist solution 14a and the blanket 15 made of PDMS, the solvent of the etch resist solution 14a permeates into the blanket 15 and causes swelling of the blanket 15. Thus, the printing process cannot be performed exactly. The reliability in forming a thin film pattern is decreased and the life of the blanket 15 is remarkably reduced.

SUMMARY OF THE INVENTION

Accordingly, the present invention is directed to an etch resist solution, a method of fabricating a thin film pattern and a method of fabricating an LCD device that substantially obviate one or more of the problems due to limitations and disadvantages of the related art.

An advantage of the present invention is to provide an etch resist solution, a method of fabricating a thin film pattern and a method of fabricating an LCD device, in which the life of a blanket is improved so that fabrication costs may be reduced and fabrication reliability may be improved.

Additional features and advantages of the invention will be set forth in part in the description which follows, and in part will be apparent from the description, or may be learned by practice of the invention. These and other advantages of the invention will be realized and attained by the composition and methods particularly pointed out in the written description and claims hereof as well as the appended drawings.

To achieve these and other advantages and in accordance with the purpose of the present invention, as embodied and broadly described, an etch resist solution includes a base polymer; a printing solvent that satisfies the condition $6 > \delta_{solvent}$ or $\delta_{solvent} > 11$, where $\delta_{solvent}$ is the solubility parameter of the solvent, or satisfies the condition $6 < \delta_{solvent} < 11$ and $\mu < 2(D)$, where $\mu$ is the dipole moment; a carrier solvent; and a surfactant.

In another aspect of the present invention, a method of fabricating a thin film pattern includes injecting an etch resist solution into a blanket on a printing roller, wherein the etch resist solution includes a printing solvent that satisfies the condition $6 > \delta_{solvent}$ or $\delta_{solvent} > 11$, where $\delta_{solvent}$ is the solubility parameter of the solvent, or satisfies the condition $6 < \delta_{solvent} < 11$ and $\mu < 2(D)$, where $\mu$ is the dipole moment of the solvent; rotating the printing roller to uniformly coat the etch resist solution on the blanket; rolling the printing roller coated with the etch resist solution onto a printing plate to pattern the etch resist solution to thereby form an etch resist pattern; transferring the etch resist pattern from the printing roller to a substrate; hardening the etch resist pattern; and forming a desired thin film pattern on the substrate using the etch resist pattern.

In another aspect of the present invention, a method of fabricating a LCD device includes preparing a thin film transistor substrate including injecting an etch resist solution into a blanket on a printing roller, wherein the etch resist solution includes a printing solvent that satisfies the condition $6 > \delta_{solvent}$ or $\delta_{solvent} > 11$, where $\delta_{solvent}$ is the solubility parameter of the solvent, or satisfies the condition $6 < \delta_{solvent} < 11$ and $\mu < 2(D)$, where $\mu$ is the dipole moment of the solvent; rotating the printing roller to uniformly coat the etch resist solution on the blanket; rolling the printing roller coated with the etch resist solution onto a printing plate to pattern the etch resist solution to thereby form an etch resist pattern; transferring the etch resist pattern from the printing roller to a substrate; hardening the etch resist pattern; and forming a desired thin film pattern on the substrate using the etch resist pattern; preparing a color filter substrate; providing a liquid crystal layer between the thin film transistor substrate and color filter substrate; and bonding the thin film transistor substrate and color filter substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or similar parts.

An apparatus and method of fabricating a thin film pattern according to an embodiment of the present invention may utilize an etch resist solution that does not damage a blanket on a printing roll. The etch resist solution is used to form a thin film pattern. Thereby, reliability of the thin film pattern is improved and at the same time the life of the blanket is improved.

A material for the solvent in the etch resist solution that does not permeate into the blanket is used in the present invention.

Figure 2:
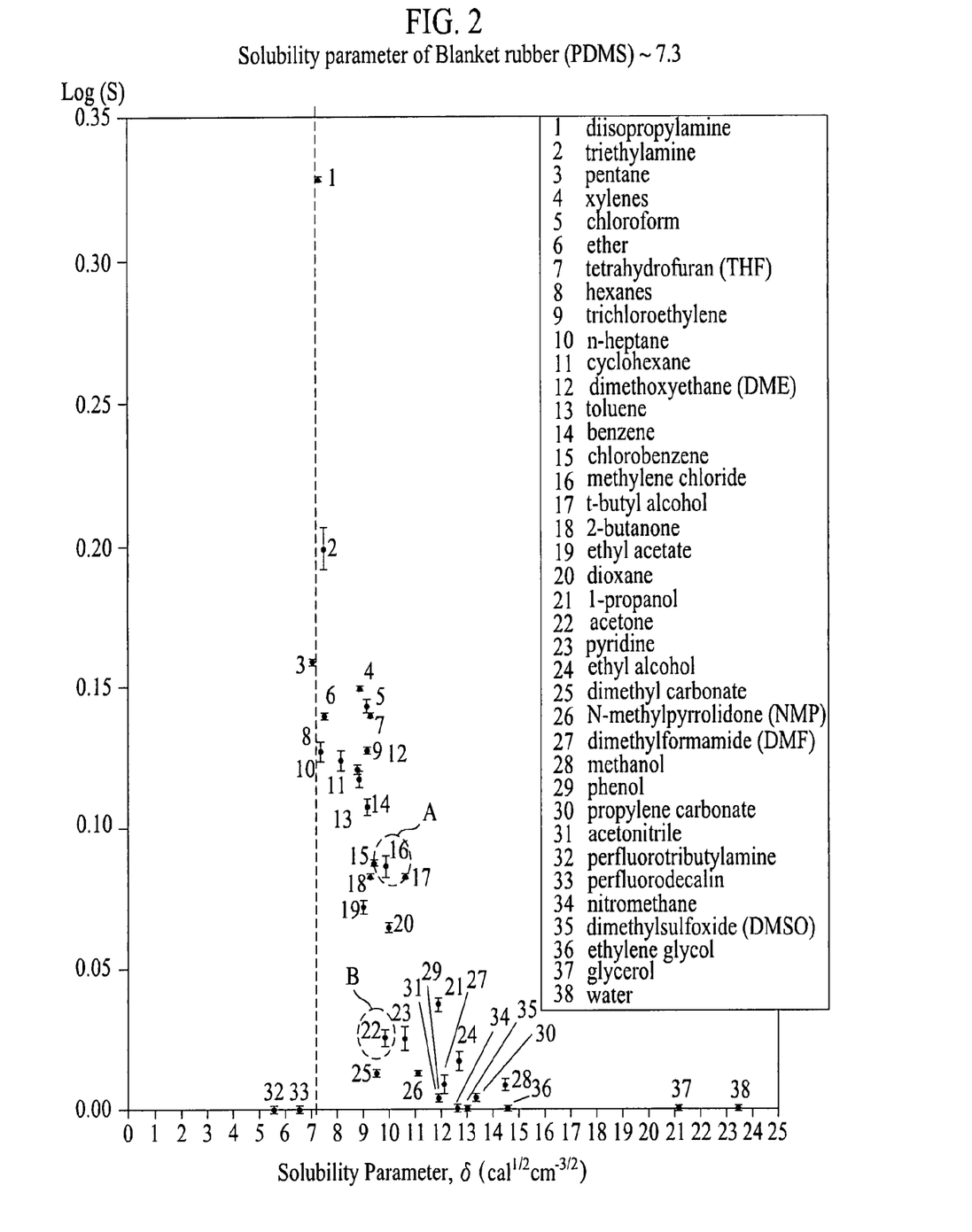
FIG. 2 is a graph illustrating solubility parameter $\delta$ of solvents and a swelling ratio of PDMS.

FIG. 2 shows a graph in which a horizontal axis represents solubility parameter $\delta$ of solvents and a vertical axis represents a swelling ratio of PDMS. The solubility parameter $\delta$ of PDMS is about 7.3 ($cal^{1/2}cm^{-3/2}$). As shown, solvents having a solubility parameter $\delta$ of about 7.3 ($cal^{1/2}cm^{-3/2}$) correspond to a relatively great swelling ratio. For example, a solvent of diisopropylamine and a solvent of triethylamine have solubility parameters $\delta$ of about 7.3 ($cal^{1/2}cm^{-3/2}$). As shown, the corresponding swelling ratios in PDMS is 0.33 (s) for diisopropylamine and 0.23 (s) for triethylamine. These ratios are relatively high. This is illustrated in Equation 1 which shows the Flory-Huggins theory.

$$\chi = (\delta_{blanket} - \delta_{solvent})^2, (\chi: \text{interaction coefficient}) \quad \text{[Equation 1]}$$

Interaction actively occurs if the interaction coefficient $\chi$ becomes close to "0," whereas interaction does not occur if the interaction coefficient $\chi$ becomes great. Thus, if a solvent having a solubility parameter $\delta$ similar to 7.3 ($cal^{1/2}cm^{-3/2}$) is used in the solution 14a when blanket 15 is made of PDMS, surface affinity increases to allow active interaction. Thereby, swelling is likely to occur in the blanket 15 as solvent permeates into the blanket 15.

Accordingly, in the present invention, solvents which satisfy the condition of Equation 2 are used to prevent swelling of the blanket.

$$6 > \delta_{solvent} \text{ or } \delta_{solvent} > 11 \quad \text{[Equation 2]}$$

The solvents which satisfy the condition of Equation 2 above have a low swelling ratio as illustrated in the graph of FIG. 2. When these solvents are inputted into Equation 1, the interaction coefficient $\chi$ becomes large. This shows that swelling of the blanket is prevented.

Also, solvents in regions A and B of FIG. 2 have a low swelling ratio even though their solubility parameter $\delta$ does not satisfy Equation 2.

These solvents in regions A and B commonly have a dipole moment $\mu$ less than $2(D)$.

Therefore, even though the solubility parameter $\delta$ of the solvents in the regions A and B does not satisfy the condition of Equation 2, if the solvents which satisfy the condition of Equation 3 below are used, swelling of the blanket can be avoided.

$$6 < \delta_{solvent} < 11 \text{ and } \mu < 2(D) \quad \text{[Equation 3]}$$

If the etch resist solution 14a is formed using the solvents which satisfy any one of Equations 2 and 3, swelling of the blanket can be avoided.

The solvents which satisfy any one of Equations 2 and 3 will be described as follows.

Any one or combination of methanol, ethanol, isopropanol, and butanol may be used as a carrier solvent. The boiling points of these alcohols are less than 100° C.

The carrier solvent lowers viscosity of the etch resist solution 14a to uniformly coat the etch resist solution 14a on the blanket 15, and should be removed directly after the etch resist solution 14a is coated on the blanket 15. Optimal removal of the carrier solvent is obtained when the boiling point of the carrier solvent is less than 100° C. Thus, any solvent having a boiling point less than 100° C. may be used as the carrier solvent.

Materials for use as a printing solvent include any one or combination of NMP(1-methyl 1-2-pyrrolidinone), diphenyl ether, propylene carbonate, and DMF (dimethyl formamide).

Properties of the printing solvents listed above are illustrated in Table 1.

TABLE 1

|  | Viscosity | Surface Tension | Boiling Point | Solubility Parameter | Dipole Moment |
|---|---|---|---|---|---|
| NMP | 1.67 | 40.7 | 202 | 11.26 | 4.08 |
| diphenyl ether | 2.13 | 26.36 | 258 | 10.1 | 1.16 |
| propylene carbonate | 2.22 | 40.7 | 242 | 13.2 | 4.98 |
| DMF | 0.79 | 36.2 | 151 | 11.84 | 3.82 |

The printing solvent affects the viscosity of the etch resist solution 14a coated on the blanket 15 and allows the solution 14a to print on the printing plate 20 or the substrate 30. Also, because the printing solvent should remain in the solution 14a until printing is completed, a solvent having a relatively high boiling point may be used as the printing solvent. The solvents listed above have relatively high boiling points of 151° C. or greater.

The composition of the etch resist solution that includes the aforementioned carrier solvent and the aforementioned printing solvent will be described as follows.

The etch resist solution 14a may include a base polymer, a carrier solvent, a printing solvent, a surfactant, and a dye.

Figure 3:
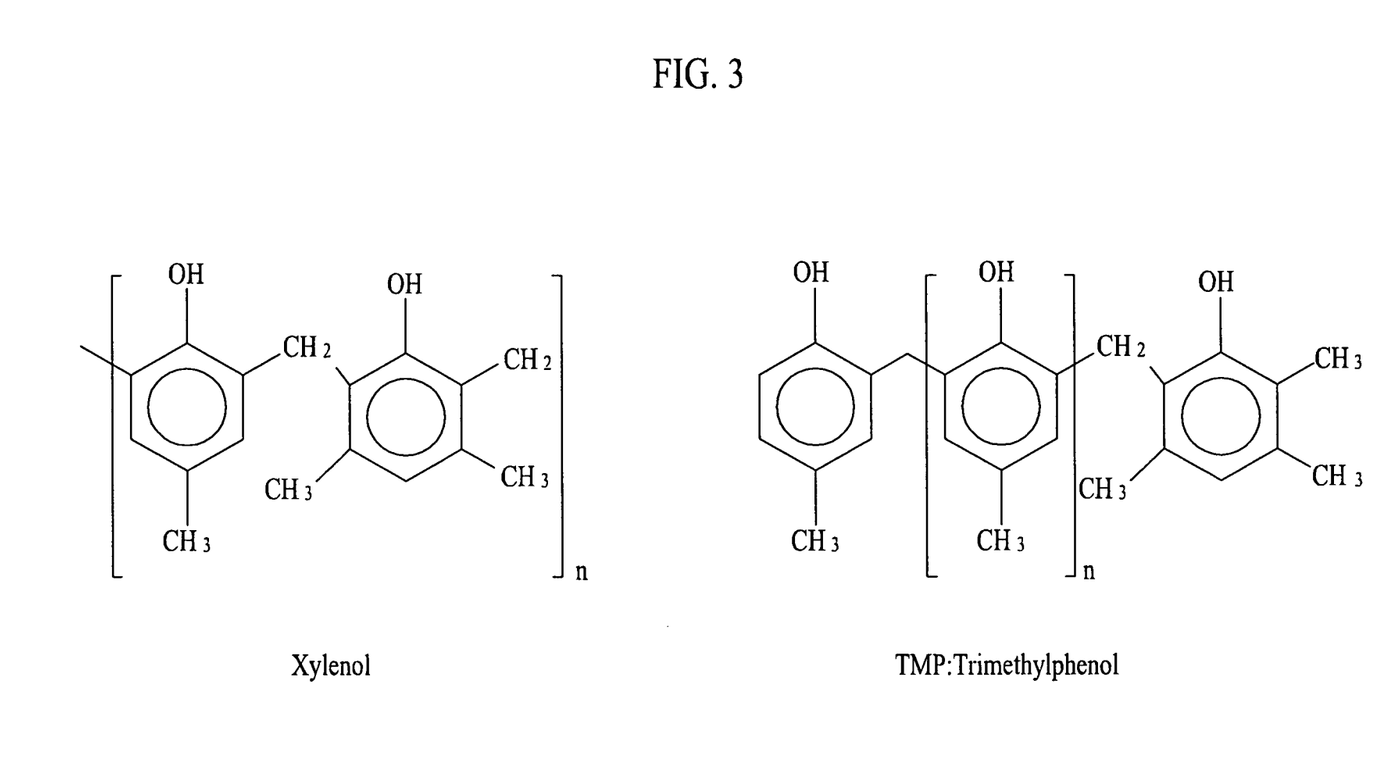
FIG. 3 is a structural formula illustrating a molecular structure of Xylenol and trimethylphenol (TMP)

The base polymer may have a content in the range of 3 to 30 wt % based on 100 ml of etch resist solution and may have a molecular weight in the range of 2000 to 100000. A material which includes at least one of meta-cresol novolac and para-cresol novolac may be used as the base polymer. Also, Xylenol and/or TMP, illustrated in FIG. 3, may be used as the base polymer.

An acid based material including any one or combination of steric acid, palmitic acid, lauric acid, and oleic acid may be used as the surfactant. Also, any one or combination of a sulfonate based material such as dioctyl(2-ethylhexyl) sulfo-succinate, phosphate ester, FOS 100 ($CF_3(CF_2)_4(CH_2CH_2O)_{10}$) or FSN-100 ($CF_3(CF_2)_5(CH_2CH_2O)_{14}$) may be used as the surfactant. The surfactant may have a content in the range of 0.01 to 3 wt % based on 100 ml of the etch resist solution.

The dye is partially added to the etch resist solution to obtain visibility after the etch resist solution is formed on the substrate by a reverse printing method. The dye may have a content in the range of 0.01 to 1.0 wt % based on 100 ml of the etch resist solution.

A dimethyl amino-phenyl based material and/or an ethyl amino-phenyl based material may be used as the dye. For example, bis(4-N-N-dimethylamino-phenyl)-(2-fluorophenyl)-methane and/or bis(4-N-N-dimethylamino-phenyl)-(2-fluorophenyl)acetonitrile may be used as the dye.

Among the solvents included in the etch resist solution based on 100 ml of the etch resist solution, the carrier solvent may occupy a content in the range of 50-90 vol % and the printing solvent may occupy a content in the range of 10-50 vol %.

The etch resist solution having the composition as described above may have a viscosity in the range of 3-6 cp and a surface tension in the range of 18-27 mN/m. Also, the etch resist solution 14a may contact the blanket 15 at an angle of about 50° or less.

If the thin film pattern is formed using the etch resist solution including the above materials, damage to the blanket may be prevented, thereby improving the life of the blanket and forming a reliable thin film pattern.

An apparatus and method of fabricating a thin film pattern using the etch resist solution of the present invention will be described with reference to FIG. 4A to FIG. 4E.

Figure 4A:
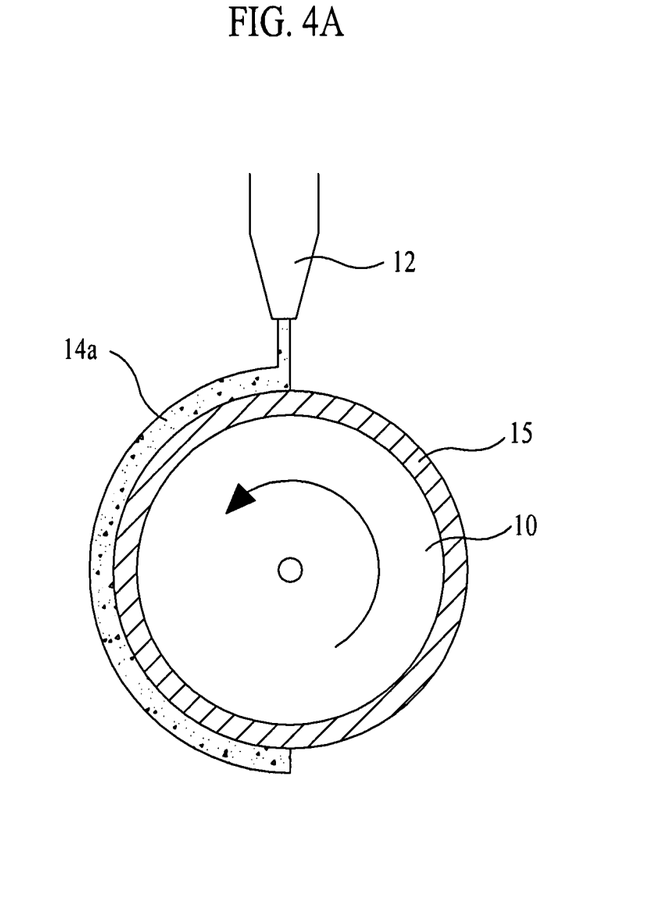
FIGS. 4A, 4B, 4C, 4D and 4E illustrate an apparatus and method of fabricating a thin film pattern according to an embodiment of the present invention.

As shown in FIG. 4A, the etch resist solution 14a from the etch resist solution injector 12 is injected into the blanket 15 wound on the printing roller 10. The printing roller 10 is rotated to uniformly coat the etch resist solution 14a on the blanket 15.

The solvent used for the etch resist solution 14a satisfies either Equation 2 or Equation 3.

Figure 4B:
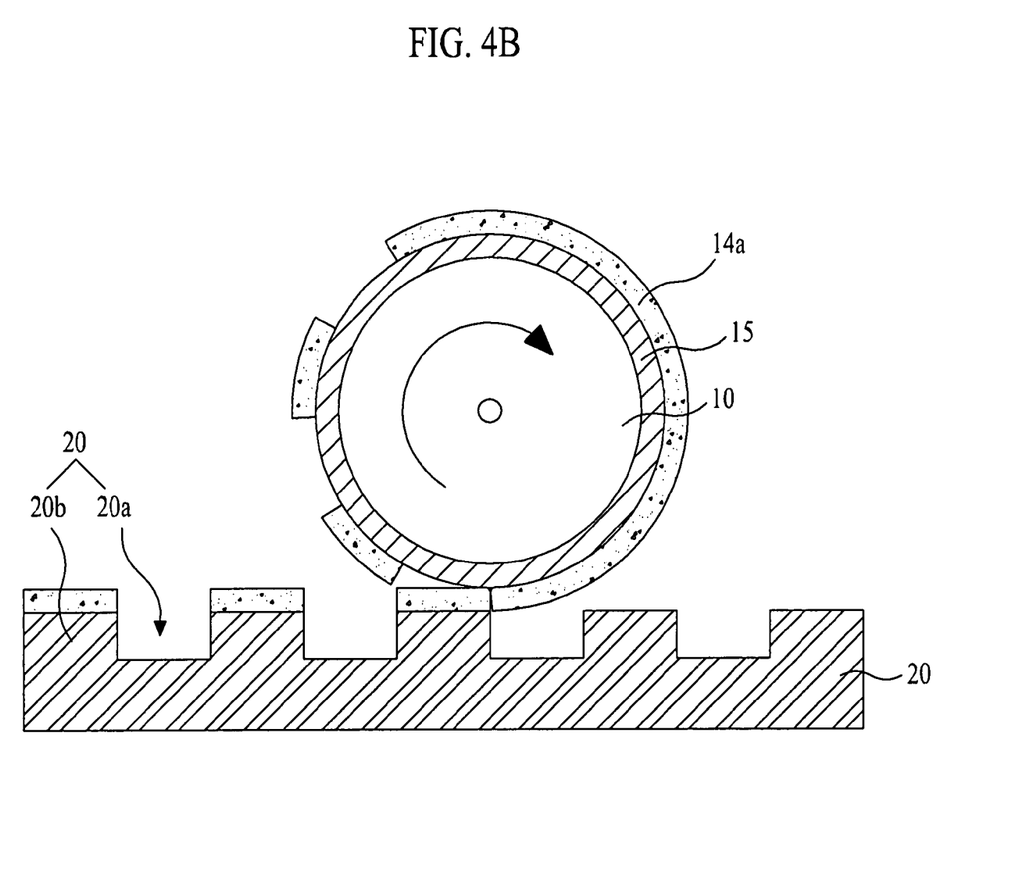
Figure 4C:
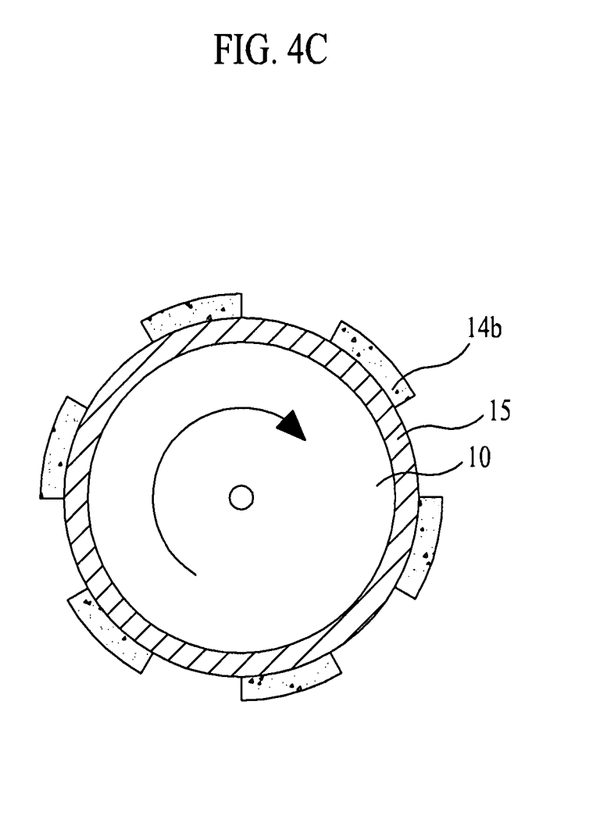

Then, as shown in FIG. 4B, the printing roller 10 coated with the etch resist solution 14a is rotated on the printing plate 20 and at the same time contacts the printing plate 20, so that the etch resist solution 14a is transferred onto the protrusion 20b only from the printing roller 10. Thus, as shown in FIG. 4C, an etch resist pattern 14b having a desired thin film pattern remains in the printing roller 10.

Figure 4D:
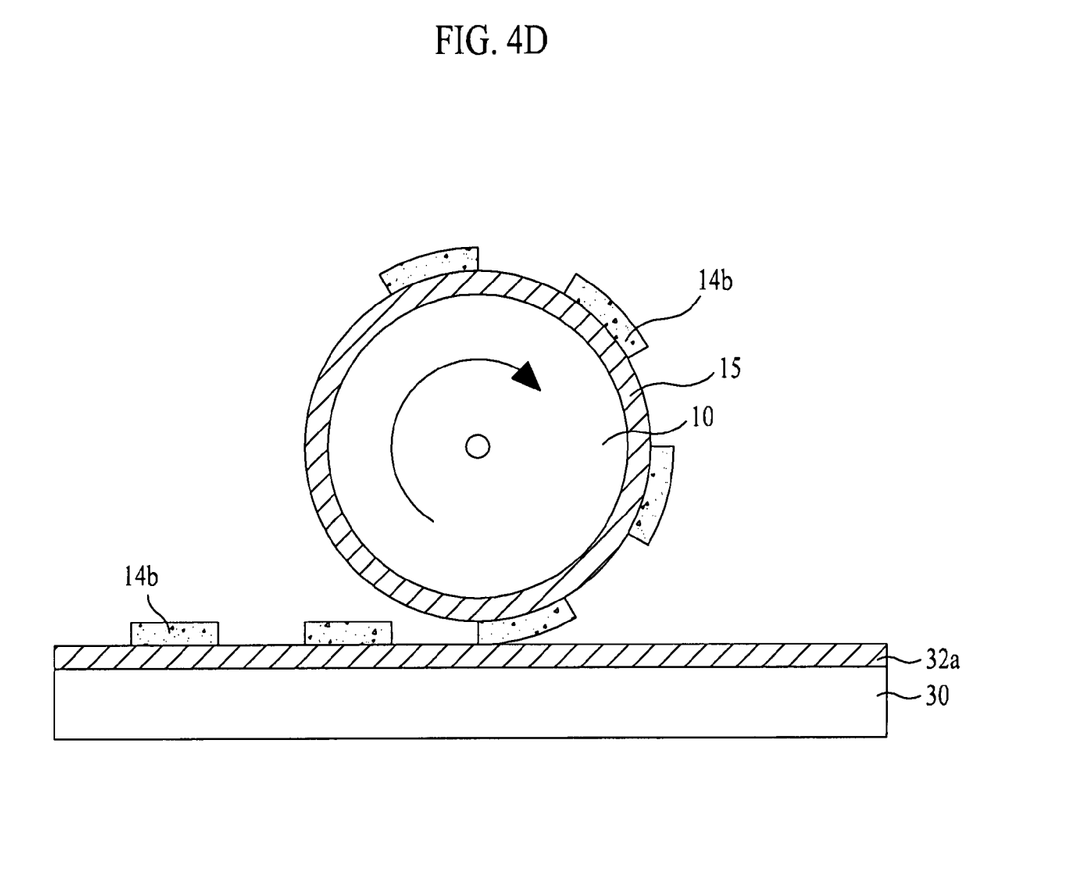
Figure 4E:
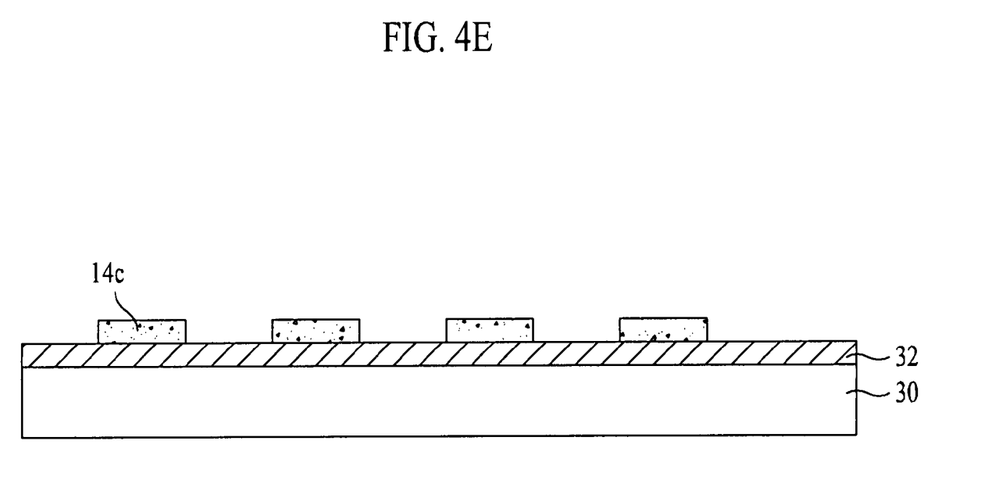

Afterwards, as shown in FIG. 4D, the etch resist pattern 14b transferred onto the printing roller 10 is then transferred onto a substrate 30 having a predetermined metal layer 32a formed thereon. Metal layer 32a may be, for example, a gate metal layer. A hardening process is then performed. As a result, as shown in FIG. 4E, an etch resist pattern 14c for patterning the metal layer 32a may be formed. Then, the metal layer 32a which is not overlapped with the etch resist pattern 14c is patterned to form a desired thin film pattern on the substrate 30.

In the aforementioned apparatus and method of fabricating a thin film pattern according to the present invention, a thin film pattern, particularly for a liquid crystal display device, may be formed. The thin film pattern may also be used in field emission devices, plasma display panels, and organic light emitting devices.

As described above, the apparatus and method of fabricating a thin film pattern according to the present invention has the following advantage.

The thin film pattern may be formed by the reverse printing method using an etch resist solution having a solubility parameter δ that satisfies the condition "$6 > \delta_{solvent}$ or $\delta_{solvent} > 11$" or having a solvent of the dipole moment μ less than 2(D). Accordingly, the life of the blanket can be improved and fabrication costs may be reduced. Also, reliability in forming the thin film pattern is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An etch resist solution, comprising:
   a base polymer;
   a printing solvent that satisfies the condition $6 > \delta_{solvent}$ or $\delta_{solvent} > 11$, where $\delta_{solvent}$ is the solubility parameter of the solvent, or satisfies the condition $6 < \delta_{solvent} < 11$ and $\mu < 2(D)$, where μ is the dipole moment;
   a carrier solvent;
   a dye of bis(4-N-N-dimethylamino-phenyl)-(2-fluorophenyl)acetonitrile; and a surfactant, wherein the surfactant includes at least one of palmitic acid, oleic acid, or a sulfonate based material such as dioctyl(2-ethylhexyl)sulfosuccinate, FOS 100 $(CF_3(CF_2)_4(CH_2CH_2O)_{10})$ or FSN-100 $(CF_3(CF_2)_5(CH_2CH_2O)_{14})$, wherein the printing solvent includes propylene carbonate, wherein the carrier solvent includes butanol, and wherein the base polymer has a content in the range of about 3 to about 30 wt %, the printing solvent has a content in the range of about 10 to about 50 vol %, the carrier solvent has a content in the range of about 50 to about 90 vol %, and the surfactant has a content in the range of about 0.01 to 3 wt %.

2. The etch resist solution of claim 1, wherein the base polymer includes at least one of meta-cresol novolac and para-cresol novolac.

3. The etch resist solution of claim 1, having a viscosity in the range of about 3 to about 6 cp and a surface tension in the range of about 18 to about 27 mN/m.

4. A method of fabricating a thin film pattern, comprising:

injecting an etch resist solution into a blanket on a printing roller, wherein the etch resist solution includes a surfactant, a dye of bis(4-N-N-dimethylamino-phenyl)-(2-fluorophenyl)acetonitrile, a carrier solvent and a printing solvent that satisfies the condition $6>\delta_{solvent}$ or $\delta_{solvent}>11$, where $\delta_{solvent}$ is the solubility parameter of the solvent, or satisfies the condition $6¢\delta_{solvent}<11$ and $\mu<2(D)$, where $\mu$ is the dipole moment of the solvent;

rotating the printing roller to uniformly coat the etch resist solution on the blanket;

rolling the printing roller coated with the etch resist solution onto a printing plate to pattern the etch resist solution to thereby form an etch resist pattern;

transferring the etch resist pattern from the printing roller to a substrate;

hardening the etch resist pattern; and forming a desired thin film pattern on the substrate using the etch resist pattern, wherein the printing solvent includes propylene carbonate, wherein the carrier solvent includes butanol, wherein the surfactant includes at least one of palmitic acid, oleic acid, or a sulfonate based material such as dioctyl(2-ethylhexyl)sulfosuccinate, FOS 100 $(CF_3(CF_2)_4(CH_2CH_2O)_{10})$ or FSN-100 $(CF_3(CF_2)_5(CH_2CH_2O)_{14})$; and wherein the etch resist solution includes a base polymer having a content in the range of about 3 to about 30 wt %, the printing solvent having a content in the range of about 10 to about 50 vol %, a carrier solvent having a content in the range of about 50 to about 90 vol %, and a surfactant having a content in the range of about 0.01 to 3 wt %.

5. The method of claim 4, wherein a conductive layer is formed on the substrate and is at least one of a gate electrode layer, a source electrode layer, a drain electrode layer, or a pixel electrode layer.

6. The method of claim 4, wherein forming the desired thin film pattern is performed by etching and wherein the etch resist pattern is removed.

7. The method of claim 6, the thin film pattern is at least one of a gate electrode, a source electrode, a drain electrode, or a pixel electrode.

8. The method of claim 4, wherein the etch resist solution further includes a base polymer of at least one of meta-cresol novolac and para-cresol novolac.

9. The method of claim 4, wherein the etch resist solution has a viscosity in the range of about 3 to about 6 cp and a surface tension in the range of about 18 to about 27 mN/m.

10. A method of fabricating a LCD device, comprising:

preparing a thin film transistor substrate including:

injecting an etch resist solution into a blanket on a printing roller, wherein the etch resist solution includes a surfactant, a dye of bis(4-N-N-dimethylamino-phenyl)-(2-fluorophenyl)acetonitrile, a carrier solvent and a printing solvent that satisfies the condition $6>\delta_{solvent}$ or $\delta_{solvent}>11$, where $\delta_{solvent}$ is the solubility parameter of the solvent, or satisfies the condition $6<\delta_{solvent}<11$ and $\mu<2(D)$, where $\mu$ is the dipole moment of the solvent;

rotating the printing roller to uniformly coat the etch resist solution on the blanket;

rolling the printing roller coated with the etch resist solution onto a printing plate to pattern the etch resist solution to thereby form an etch resist pattern;

transferring the etch resist pattern from the printing roller to a substrate;

hardening the etch resist pattern; and forming a desired thin film pattern on the substrate using the etch resist pattern;

preparing a color filter substrate;

providing a liquid crystal layer between the thin film transistor substrate and color filter substrate; and bonding the thin film transistor substrate and color filter substrate, wherein the printing solvent includes propylene carbonate, wherein the carrier solvent includes butanol, wherein the surfactant includes at least one of palmitic acid, oleic acid, or a sulfonate based material such as dioctyl(2-ethylhexyl)sulfosuccinate, FOS 100 $(CF_3(CF_2)_4(CH_2CH_2O)_{10})$ or FSN-100 $(CF_3(CF_2)_5(CH_2CH_2O)_{14})$;

wherein the etch resist solution includes a base polymer having a content in the range of about 3 to about 30 wt %, the printing solvent having a content in the range of about 10 to about 50 vol %, a carrier solvent having a content in the range of about 50 to about 90 vol %, and a surfactant having a content in the range of about 0.01 to 3 wt %.

11. The method of claim 10, wherein the prepared thin film transistor substrate includes a gate electrode, a source electrode, a drain electrode, and a pixel electrode.

12. The method of claim 10, wherein forming the desired thin film pattern is performed by etching and wherein the etch resist pattern is removed.

13. The method of claim 10, the thin film pattern is at least one of a gate electrode, a source electrode, a drain electrode, or a pixel electrode.

14. The method of claim 10, wherein the etch resist solution further includes a base polymer of at least one of meta-cresol novolac and para-cresol novolac.

15. The method of claim 10, wherein the etch resist solution has a viscosity in the range of about 3 to about 6 cp and a surface tension in the range of about 18 to about 27 mN/m.

* * * * *